(12) United States Patent
Minamio et al.

(10) Patent No.: US 7,528,884 B2
(45) Date of Patent: May 5, 2009

(54) OPTICAL DEVICE

(75) Inventors: Masanori Minamio, Osaka (JP);
Tetsushi Nishio, Kyoto (JP)

(73) Assignee: Panasonic Corporation, Osaka (JP)

( * ) Notice: Subject to any disclaimer, the term of this patent is extended or adjusted under 35 U.S.C. 154(b) by 668 days.

(21) Appl. No.: 10/975,016

(22) Filed: Oct. 28, 2004

(65) Prior Publication Data

US 2005/0169620 A1 Aug. 4, 2005

(30) Foreign Application Priority Data

Feb. 2, 2004 (JP) ............................. 2004-025062
Aug. 23, 2004 (JP) ............................. 2004-242845

(51) Int. Cl.
*H04N 5/225* (2006.01)
(52) U.S. Cl. ..................... 348/373; 250/208.1; 348/335
(58) Field of Classification Search ................ 348/335, 348/340, 357, 373, 374, 345; 396/71; 257/678; 251/431; 250/208, 1, 239; 359/811, 819, 359/822, 823
See application file for complete search history.

(56) References Cited

U.S. PATENT DOCUMENTS

| | | | |
|---|---|---|---|
| 3,981,074 A | 9/1976 | Yamamoto et al. | |
| 6,204,454 B1 | 3/2001 | Gotoh et al. | |
| 6,509,636 B1 * | 1/2003 | Tsai et al. | 257/678 |
| 6,590,269 B1 * | 7/2003 | Chuang et al. | 257/432 |
| 6,610,563 B1 * | 8/2003 | Waitl et al. | 438/166 |
| 6,768,516 B2 | 7/2004 | Yamada et al. | |
| 7,453,517 B2 * | 11/2008 | Fujimoto et al. | 348/374 |
| 2005/0168845 A1 * | 8/2005 | Minamio et al. | 359/819 |

FOREIGN PATENT DOCUMENTS

| | | |
|---|---|---|
| CN | 2598149 Y | 1/2004 |
| CN | 2612063 Y | 4/2004 |
| JP | 62-92661 A | 3/1987 |
| JP | 8-288594 | 11/1996 |
| JP | 09-055487 | 2/1997 |

(Continued)

OTHER PUBLICATIONS

Chinese Office Action, with English Translation, issued in corresponding Chinese Patent Application No. 200410085754.8, dated on Jul. 27, 2007.

(Continued)

*Primary Examiner*—David L Ometz
*Assistant Examiner*—Ahmed A Berhan
(74) *Attorney, Agent, or Firm*—McDermott Will & Emery LLP

(57) ABSTRACT

An optical device includes a base of ring shape, and an optical chip and a transparent plate both attached to the base. The upper surface of the base is formed with a tapered recess inclined downwardly from its flat portion toward the opening. A gap between the tapered recess and the transparent plate is formed with an adhesive layer. Even if a gap between the transparent plate and the flat portion of the base is narrowed, the adhesive layer with a great thickness present between the tapered recess and the lower surface of the transparent plate maintains the mechanical adhesion strength between the base and the transparent plate. A raised ring and a recessed ring prevent adhesive from entering a positioning hole and the opening.

21 Claims, 9 Drawing Sheets

FOREIGN PATENT DOCUMENTS

| | | |
|---|---|---|
| JP | 10-65035 | 3/1998 |
| JP | 10-154762 | 6/1998 |
| JP | 10-209314 | 8/1998 |
| JP | 11-111959 | 4/1999 |
| JP | 11-195723 | 7/1999 |
| JP | 11-261044 | 9/1999 |
| JP | 2000-58805 | 2/2000 |
| JP | 2000-286401 | 10/2000 |
| JP | 2001-358997 | 12/2001 |
| JP | 2002-43554 | 2/2002 |
| JP | 2002-203920 | 7/2002 |
| JP | 2002-279683 | 9/2002 |
| JP | 2002-299592 | 10/2002 |
| JP | 2003-324635 | 11/2003 |
| WO | WO 02/054500 A1 | 7/2002 |

OTHER PUBLICATIONS

Japanese Office Action issued in Japanese Patent Application No. JP 2004-242845, dated Nov. 20, 2007.

* cited by examiner

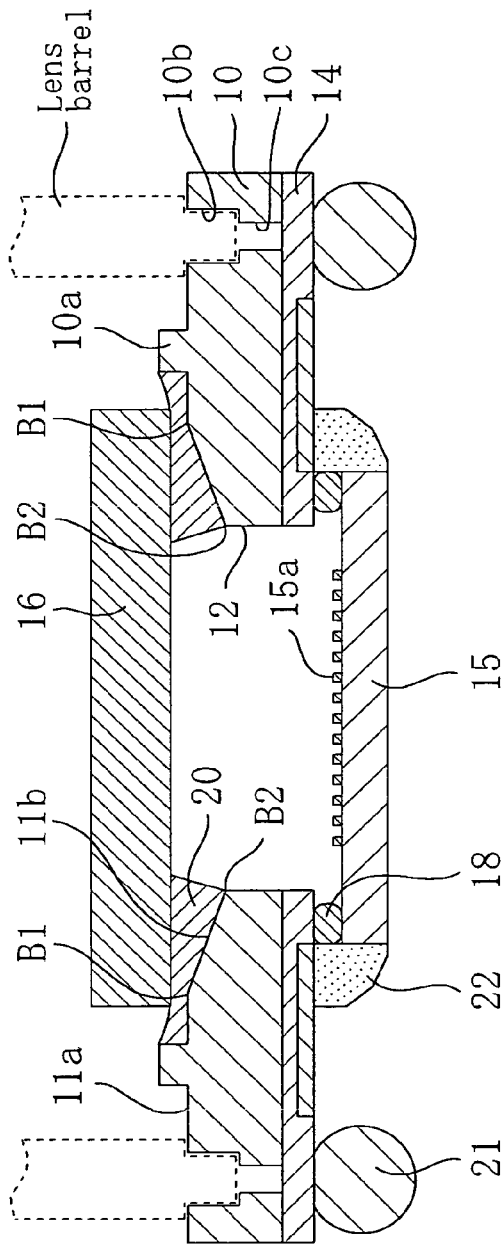
FIG. 2A
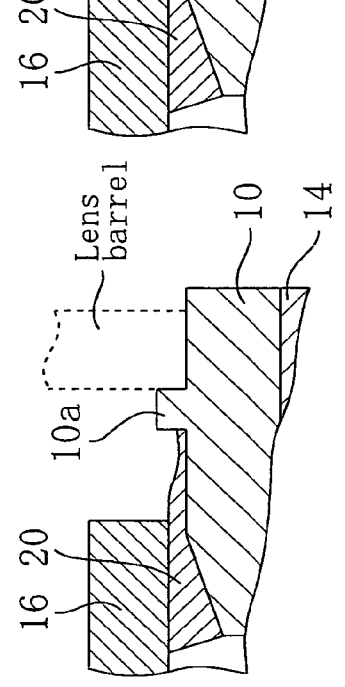
FIG. 2D
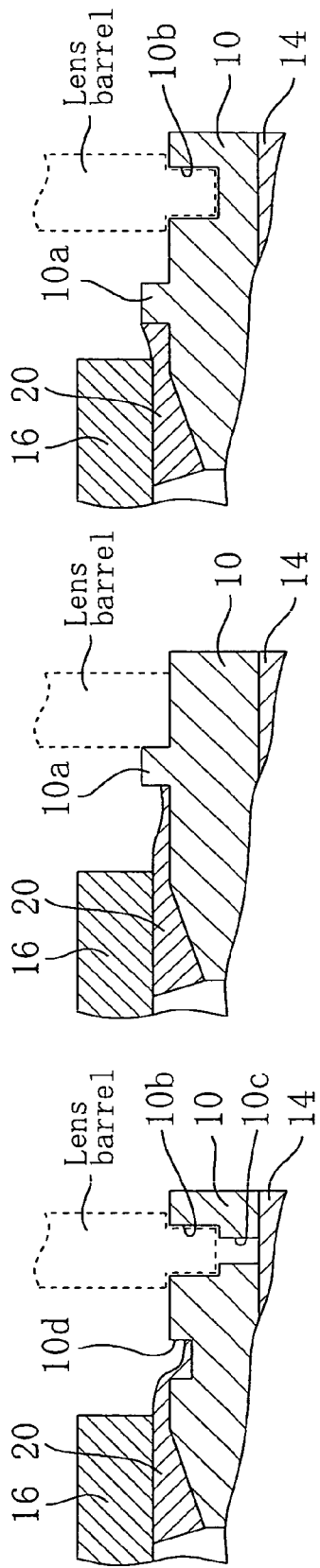
FIG. 2C
FIG. 2B

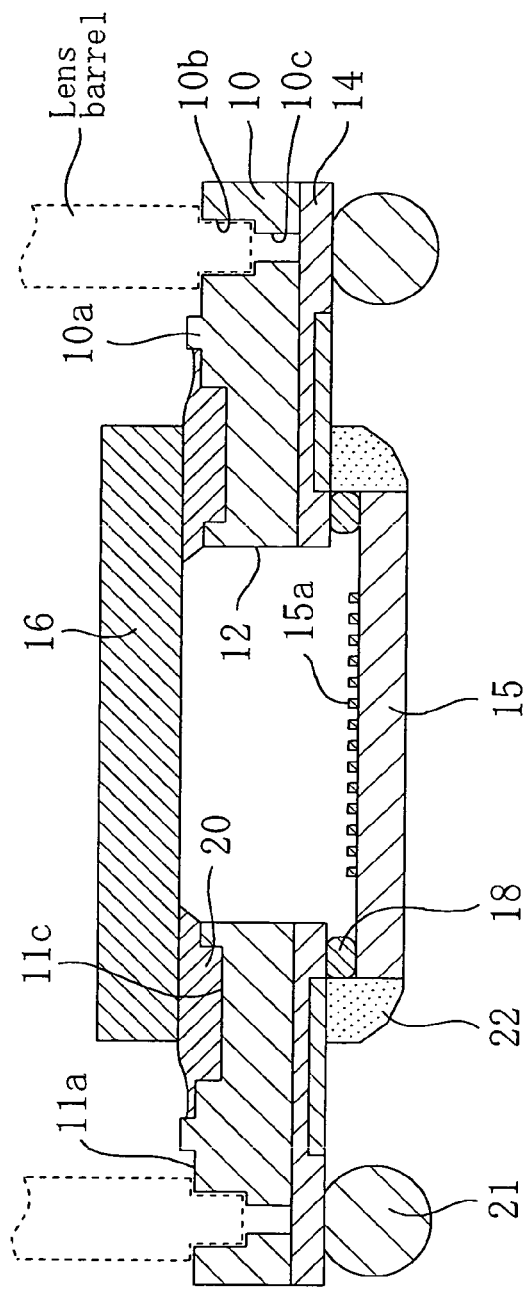
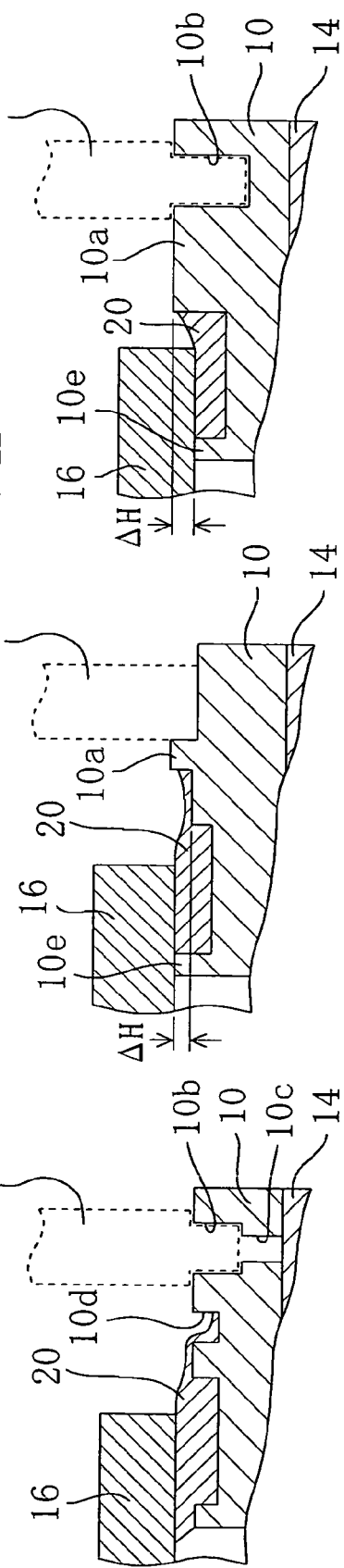
FIG. 4A  FIG. 4B  FIG. 4C  FIG. 4D

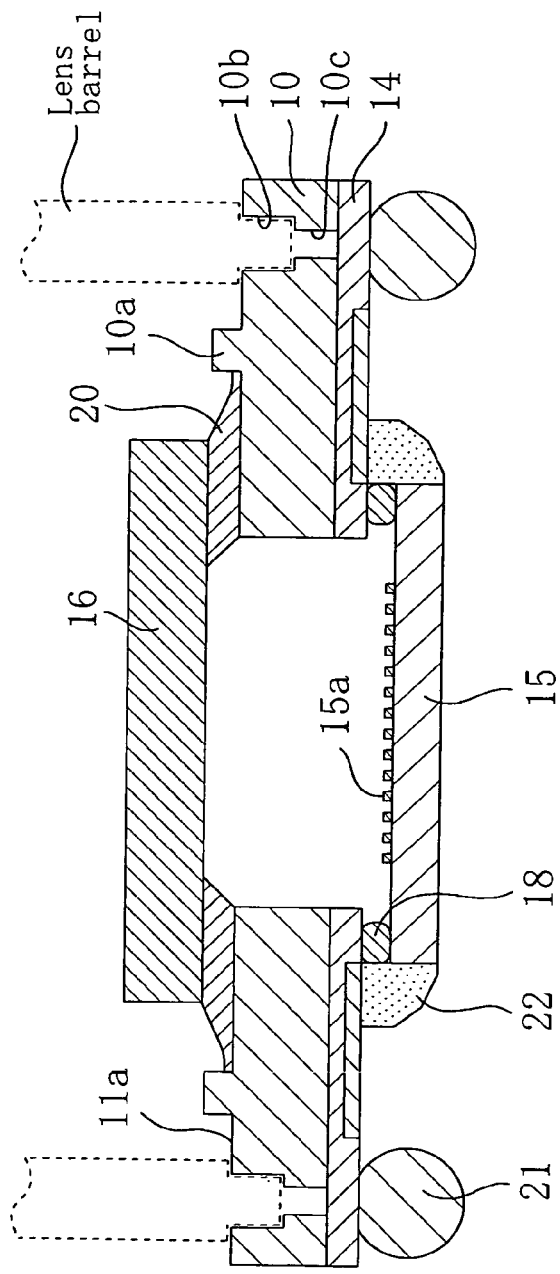
FIG. 8A
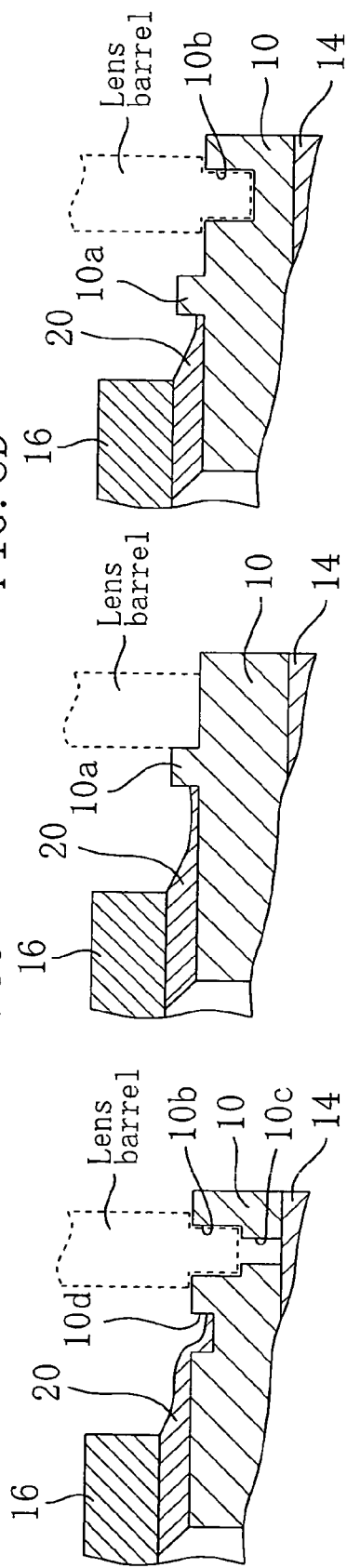
FIG. 8B
FIG. 8C
FIG. 8D

OPTICAL DEVICE

CROSS REFERENCE TO RELATED APPLICATIONS

This application claims priority under 35 U.S.C. § 119 on Patent Application No. 2004-025062 filed in Japan on Feb. 2, 2004 and Patent Application No. 2004-242845 filed in Japan on Aug. 23, 2004, the entire contents of which are hereby incorporated by reference.

BACKGROUND OF THE INVENTION (a) Fields of the Invention

The present invention relates to optical devices which have optical chips mounted thereon and which are used for cameras such as camcorders, digital cameras, or digital still cameras and optical pickup systems for CDs, DVDs, or MDs.

(b) Description of Related Art

In recent years, optical devices have been incorporated in cameras such as camcorders, digital cameras, or digital still cameras and optical pickup systems for CDs, DVDs, or MDs. The optical devices are each provided in a package form produced in such a manner that an optical chip is mounted on a base of an insulating material and that the mounted optical chip is packaged with its main surface covered with a transparent plate.

FIG. 9 is a sectional view showing the structure of a solid-state image sensing device which is a type of conventional optical device (see Document 1 (Japanese Unexamined Patent Publication No. 2002-43554)). Referring to FIG. 9, the solid-state image sensing device includes, as main components, a base 131, a solid-state image sensing element 135, a transparent plate 136, and an adhesive layer 140. The base 131 of frame shape is made of thermosetting resin and has an opening 132 in its center portion. The solid-state image sensing element 135 is formed of, for example, a CCD and attached to the lower surface side of the base 131. The transparent plate 136 is made of glass and attached to the upper surface side of the base 131 so that the plate faces the solid-state image sensing element 135 with the opening 132 interposed therebetween. The adhesive layer 140 mechanically connects the transparent plate 136 to the base 131.

The lower surface of the base 131 is provided with wires 134 which are made of a gold plated layer and are embedded in the resin. The solid-state image sensing element 135 is attached to the lower surface of the base 131 and disposed so that a light receiving region 135a thereof is exposed in the opening 132.

The solid-state image sensing element 135 is provided with electrode pads (not shown) for sending and receiving signals between the solid-state image sensing element 135 and external equipment. At an end of each wire 134 adjacent to the opening 132, an internal terminal portion is exposed from the resin. The internal terminal portion of each wire 134 and the corresponding electrode pad of the solid-state image sensing element are electrically connected to each other with a bump (protruding electrode) 138 interposed therebetween. In addition, a solder ball 141 is annexed onto an external terminal portion of each wire 134. On the lower surface of the base 131, the solid-state image sensing element 135, the wires 134, and the bumps 138 are hermetically sealed with a sealing resin 137 provided around the solid-state image sensing element 135.

The solid-state image sensing device thus constructed is mounted on a circuit board in the state in which the transparent plate 136 is directed upward as shown in FIG. 9. A lens barrel with an optical imaging system incorporated therein is fixed onto the base 131 as shown by the broken lines in FIG. 9. The positional relation between the lens barrel and the base 131 has a defined accuracy required to fall within a predetermined error.

As mentioned above, the light receiving region 135a of the solid-state image sensing element 135 is disposed in the opening 132 when viewed from above. Through the optical imaging system incorporated in the lens barrel, light from an imaged object is condensed on the light receiving region 135a of the solid-state image sensing element 135. The condensed light is converted into electricity by the solid-state image sensing element 135.

Also, another example of the solid-state image sensing device has been known which uses a base having, unlike the base 131 shown in FIG. 9, a recess formed in its surface on which a solid-state image sensing element is mounted (for example, see Document 2 (Japanese Unexamined Patent Publication No. 2000-58805)).

Note that if a light receiving element and a light emitting element are disposed in the optical device, the light emitting element with a relatively small dimension is generally mounted above the light receiving element.

In recent years, optical devices with light receiving and light emitting elements disposed therein have also been put into practical use. In such devices, instead of the transparent plate 136, a hologram is attached onto the base 131 (to form a hologram unit).

SUMMARY OF THE INVENTION

The structure of the conventional solid-state image sensing device shown in FIG. 9, however, has a severe restriction on the dimension H shown in FIG. 9. This restriction causes the following disadvantage.

Specifically, the allowable range of the dimension H shown in FIG. 9 is fixed at a given upper limit (for example, about 350 μm) or lower. On the other hands, in order to secure the strength of the transparent plate 136 (glass plate), the plate has to have a certain amount of thickness. Moreover, in consideration of variations in thickness between fabricated plates, the allowable upper limit of the thickness A of the adhesive layer 140 will be extremely low. However, if the thickness of the adhesive layer 140 is reduced too much, the adhesion strength between the base 131 and the transparent plate 136 becomes extremely weak, which may degrade the reliability of the device.

The device in which, instead of the transparent plate 136, a hologram is mounted on the base 131 also has the same disadvantage.

An object of the present invention is to provide an optical device with high reliability by taking measures to secure the adhesion strength as well as to satisfy the dimensional restriction mentioned above.

An optical device of the present invention has a structure that a recess is formed in the upper surface of a base in ring shape for mounting a window member or a hologram thereon and an adhesive layer is provided in the recess.

With this structure, even if a gap between the upper surface of the base and the lower surface of a transparent member is narrowed, the adhesive layer in the recess can be adequately thickened. Therefore, the mechanical adhesion strength between the base and the transparent member can be maintained at a high level. Consequently, the height of the device can be reduced and concurrently the reliability of the optical device can be improved.

As the recess, use is made of a tapered recess formed in a region adjoining the opening of the base or a groove-like recess.

A flow-stemming portion for stemming a flow of an adhesive forming the adhesive layer can be provided in or on the main surface of the base to prevent overflow of the adhesive.

As the flow-stemming portion, use is made of a roughly finished area, a raised ring, a recessed ring, and the like.

The base is provided with a positioning hole serving as a reference to the position at which a member to be annexed onto the optical device is attached. This simplifies procedures and work by which the optical device is assembled in a system utilizing the device, and improves the accuracy of assembly.

BRIEF DESCRIPTION OF THE DRAWINGS

FIGS. 2A to 2D are sectional views of optical devices according to a second embodiment and first to third modifications of the second embodiment, respectively.

FIGS. 4A to 4D are sectional views of optical devices according to a fourth embodiment and first to third modifications of the fourth embodiment, respectively.

FIGS. 8A to 8D are sectional views of optical devices according to an eighth embodiment and first to third modifications of the eighth embodiment, respectively.

DETAILED DESCRIPTION OF THE PREFERRED EMBODIMENTS

First Embodiment

Figure 1:
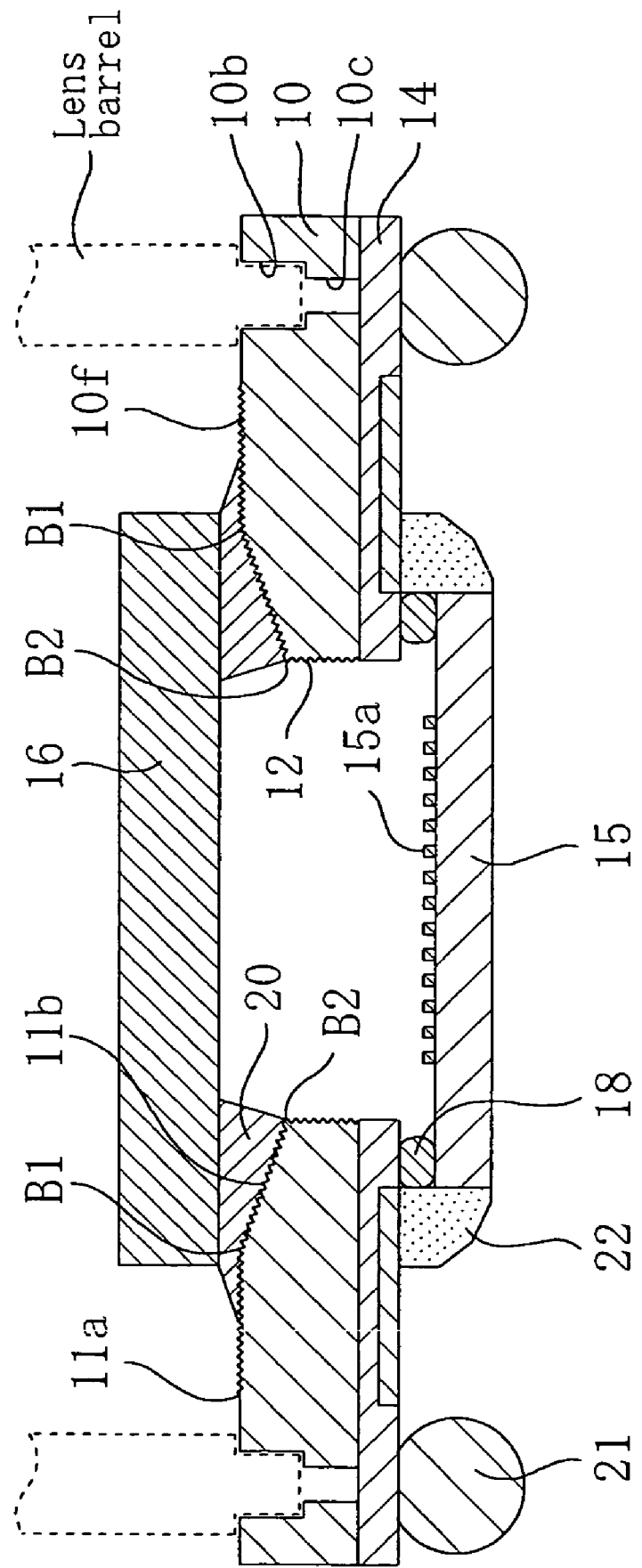
FIG. 1 is a sectional view showing the structure of an optical device according to a first embodiment.

FIG. 1 is a sectional view of an optical device according to a first embodiment. The optical device of this embodiment includes, as main components, a base 10, an optical chip 15, a transparent plate 16, and an adhesive layer 20. The base 10 of frame shape is made of thermosetting resin such as epoxy resin and has an opening 12 in its center portion. The optical chip 15 is attached to the lower surface side of the base 10. The transparent plate 16 is made of glass and attached to the upper surface side of the base 10 so that the plate faces the optical chip 15 with the opening 12 interposed therebetween. The adhesive layer 20 mechanically connects the transparent plate 16 to the base 10. The optical chip 15 of the first embodiment indicates only a light receiving element such as a CCD (charge-coupled device) solid-state image sensing element. However, a light receiving element and a semiconductor laser (light emitting element) may be installed in the optical chip 15. In this case, if the optical device of the first embodiment is incorporated in an optical pickup or the like, the transparent plate 16 is removed and a hologram as shown in a fifth embodiment is then attached onto the base 10 (to form a hologram unit).

The lower surface of the base 10 is provided with a wire 14 which is made of a gold plated layer and which is embedded in a resin. The optical chip 15 is attached to the lower surface of the base 10 and disposed so that a main surface 15a thereof is exposed in the opening 12.

The optical chip 15 is provided with an electrode pad (not shown) for sending and receiving signals between the optical chip 15 and external equipment. An internal terminal portion is formed in an edge of the wire 14 adjacent to the opening 12, and thus the internal terminal portion of the wire 14 and the electrode pad are electrically connected to each other with a bump (protruding electrode) 18 interposed therebetween. In addition, a solder ball 21 is annexed onto an external terminal portion of the wire 14. On the lower surface side of the base 10, the optical chip 15, the wire 14, and the bump 18 are hermetically sealed with a sealing resin 22 provided around the optical chip 15.

The optical device thus constructed is mounted on a circuit board so that the transparent plate 16 is directed upward as shown in FIG. 1. A lens barrel with an optical imaging system incorporated therein is installed onto the base 10 as shown by the broken lines in FIG. 1. The positional relation between the lens barrel and the base 10 has a defined accuracy required to fall within a predetermined error. The base 10 is formed with a first positioning hole 10b for determining the position at which the lens barrel is attached to the base 10. Further, in alignment with the first positioning hole 10b, a second positioning hole 10c is formed which has a smaller diameter than the first positioning hole 10b and determines the position at which the optical chip 15 is attached to base 10. That is to say, the positioning holes 10b and 10c constitute a stepped hole. Note that the positioning holes 10b and 10c do not always have to be provided therein.

As mentioned above, the main surface 15a of the optical chip 15 is disposed in the opening 12 when viewed from above. Through the optical system incorporated in the lens barrel, light from an imaged object is condensed on the main surface 15a of the optical chip 15.

As shown in FIG. 1, in the first embodiment, the upper surface of the base 10 is formed with a flat portion 11a and a tapered recess 11b as a recess. The adhesive layer 20 is formed to fill a gap between part of the flat portion 11a of the base 10 and the lower surface of the transparent plate 16 and between the whole of the tapered recess 11b and the lower surface of the transparent plate 16. Moreover, at least an area of the flat portion 11a of the base 10 in contact with the tapered recess 11b, the tapered recess 11b, and the wall surface inside the opening 12 are formed of a roughly finished area 10f having a surface roughness Rz of, for example, 5 to 35 μm or more. The roughly finished area 10f is formed by conducting a resin sealing process using a sandblasted metal mold for sealing. High surface roughness of the flat portion 11a or other portions prevents an adhesive applied to form the adhesive layer 20 from entering the positioning holes 10b and 10c and the opening 12. However, if the entry of the adhesive into the side of the opening 12 does not cause any problem, even the tapered recess 11b and the wall surface inside the opening 12 do not have to be roughly finished. In other words, as long as the roughly finished area 10f is formed at least over a region of the flat portion 11a (upper surface) of the base 10 extending outwardly a predetermined distance from just below the side edge of the transparent member 16, the function of preventing the adhesive flow can be obtained. As a treatment for roughening the surface, a treatment other than the sandblasting, such as etching, can also be used.

In the first embodiment, the tapered recess 11b as a recess is formed in the upper surface of the base 10, and the adhesive layer 20 is formed in the gap between the tapered recess 11b and the transparent plate 16. Therefore, even if the gap between the flat portion 11a and the transparent plate 16 is narrowed, the adhesive layer 20 in the tapered recess 11b can be adequately thickened. This makes it possible to maintain the mechanical adhesion strength between the transparent plate 16 and the base 10 at a high level even though the gap between the lower surface of the transparent plate 16 and the upper surface of the base 10 is narrowed. Consequently, a downsized optical device with high reliability can be provided.

If the adhesive layer 20 is thickened, at the time of application of an adhesive, a thickly applied adhesive may flow into the first and second positioning holes 10b and 10c and into the side of the opening 12. However, in the first embodiment, since part of the flat portion 11a of the base 10 and the like has a high surface roughness, the adhesive flow is stemmed to prevent the adhesive from entering the first and second positioning holes 10b and 10c and the opening 12. Therefore, even if the gap between the lower surface of the transparent plate 16 and the upper surface of the base 10 is narrowed, the mechanical adhesion strength between the transparent plate 16 and the base 10 can be maintained at a high level while problems caused by protrusion of the adhesive are prevented. Consequently, a downsized optical device with high reliability can be provided.

In the first embodiment, the boundary B1 between the flat portion 11a and the tapered recess 11b of the upper surface of the base 10 is positioned in overlapping relation with the transparent plate 16 when viewed from above. By this relation, the flat portion 11a supports the transparent plate 16 and further the adequately thick adhesive layer is present between the tapered recess 11b and the transparent plate 16. Therefore, even if, in forming the adhesive layer 20, pressure applied to the transparent plate 16 fluctuates more or less to change the distance of the gap between the flat portion 11a and the transparent plate 16, the effects of the first embodiment can be exerted with reliability.

In the first embodiment, the difference in vertical position between the bottommost and topmost parts of the tapered recess 11b is preferably within 100 to 500 µm. The adhesive layer 20 need not cover the whole of the tapered recess 11b, and need only cover at least part of the inclined surface 11b.

Even if the cross-sectional shape of the tapered recess 11b of the base 10 is not a flat plane like the first embodiment but a curve plane, the same effects as the first embodiment can be exerted.

Second Embodiment

FIGS. 2A to 2D are sectional views of optical devices according to a second embodiment and first to third modifications of the second embodiment, respectively.

Referring to FIG. 2A, the optical device of the second embodiment basically has the same structure as that of the first embodiment shown in FIG. 1. The device of the second embodiment differs from the device of the first embodiment in that the flat portion 11a of the base 10 is formed not to have a rough surface but to have a raised ring 10a located a predetermined distance away from the point of the flat portion 11a below the side edge of the transparent plate 16. The raised ring 10a prevents the adhesive applied to form the adhesive layer 20 from entering the positioning holes 10b and 10c.

In the second embodiment, the tapered recess 11b as a recess is formed in the upper surface of the base 10, and the adhesive layer 20 is formed in the gap between the tapered recess 11b and the transparent plate 16. Therefore, even if the gap between the flat portion 11a and the transparent plate 16 is narrowed, the adhesive layer 20 in the tapered recess 11b can be adequately thickened. If the adhesive layer 20 is thickened, at the time of application of an adhesive, a thickly applied adhesive may flow into the positioning holes 10b and 10c. However, in the second embodiment, since the raised ring 10a is formed on the flat portion 11a of the base 10, the side wall of the raised ring 10a stems the adhesive flow to prevent the adhesive from entering the positioning holes 10b and 10c. Therefore, even if the gap between the lower surface of the transparent plate 16 and the upper surface of the base 10 is narrowed, the mechanical adhesion strength between the transparent plate 16 and the base 10 can be maintained at a high level while protrusion of the adhesive is prevented. Consequently, a downsized optical device with high reliability can be provided.

First Modification of Second Embodiment

In a first modification of the second embodiment shown in FIG. 2B, as a substitute for the raised ring, a recessed ring 10d is formed in an area of the flat portion 11a of the base 10 a predetermined distance away from the point below the side edge of the transparent plate 16. The recessed ring 10d prevents the adhesive applied to form the adhesive layer 20 from entering the positioning holes 10b and 10c.

In the first modification, the tapered recess 11b as a recess is formed in the upper surface of the base 10, and the adhesive layer 20 is formed in the gap between the tapered recess 11b and the transparent plate 16. Therefore, even if the gap between the flat portion 11a and the transparent plate 16 is narrowed, the adhesive layer 20 in the tapered recess 11b can be adequately thickened. If the adhesive layer 20 is thickened, at the time of application of an adhesive, a thickly applied adhesive may flow into the first and second positioning holes 10b and 10c. However, in the first modification, since the recessed ring 10d is formed in the flat portion 11a of the base 10, the adhesive flow is stemmed with the side wall inside the recessed ring 10d to prevent the adhesive from entering the first and second positioning holes 10b and 10c. Therefore, even if the gap between the lower surface of the transparent plate 16 and the upper surface of the base 10 is narrowed, the mechanical adhesion strength between the transparent plate 16 and the base 10 can be maintained at a high level while protrusion of the adhesive is prevented. Consequently, a downsized optical device with high reliability can be provided.

Second Modification of Second Embodiment

A second modification of the second embodiment shown in FIG. 2C is the same as the second embodiment in that the raised ring 10a is formed on the flat portion 11a of the base 10. However, in the second modification, the raised ring 10a functions also as a positioning member of the lens barrel, and the positioning holes 10b and 10c are not provided. Therefore, in the second modification, the radially inner side wall of the raised ring 10a stems outward flow of the adhesive applied to form the adhesive layer 20, while the radially outer side wall of the raised ring 10a positions the lens barrel.

In the second modification, the tapered recess 11b as a recess is formed in the upper surface of the base 10, and the adhesive layer 20 is formed in the gap between the tapered recess 11b and the transparent plate 16. Therefore, even if the gap between the flat portion 11a and the transparent plate 16 is narrowed, the adhesive layer 20 in the tapered recess 11b can be adequately thickened. If the adhesive layer 20 is thickened, at the time of application of an adhesive, a thickly applied adhesive may flow into the region where the lens barrel will be installed. However, in the second modification, since the raised ring 10a is formed on the flat portion 11a of the base 10, the radially inner side wall of the raised ring 10a stems the adhesive flow to prevent the adhesive from entering the region where the lens barrel will be installed while the radially outer side wall of the raised ring 10a positions the lens barrel. Therefore, even if the gap between the lower surface of the transparent plate 16 and the upper surface of the base 10 is narrowed, the mechanical adhesion strength between the transparent plate 16 and the base 10 can be maintained at a high level while protrusion of the adhesive is prevented. Consequently, a downsized optical device with high reliability can be provided.

Third Modification of Second Embodiment

A third modification of the second embodiment shown in FIG. 2D is the same as the second embodiment in that the raised ring 10a is formed on the flat portion 11a of the base 10. However, in the third modification, no second positioning hole is provided although the first positioning hole 10b is provided. The positioning hole 10b in the third modification is a hole with a bottom, but it may alternatively be a through hole.

The first and second positioning holes 10b and 10c are not necessarily required also in the first and second embodiments and the first modification of the second embodiment. Also to the optical device having either or none of the first and second positioning holes 10b and 10c, the first and second embodiments and the first modification of the second embodiment can be applied to exert their effects. The reason for this is as follows. Even if the positioning holes 10b and 10c are absent, an adhesive flow into the region where the lens barrel will be installed would cause problems such as tilted installment of the lens barrel.

Also in the second embodiment and its modifications, like the first embodiment, the boundary B1 between the flat portion 11a and the tapered recess 11b of the upper surface of the base 10 is positioned in overlapping relation with the transparent plate 16 when viewed from above. By this relation, the flat portion 11a supports the transparent plate 16 and further the adequately thick adhesive layer is present between the tapered recess 11b and the transparent plate 16. Therefore, even if, in forming the adhesive layer 20, pressure applied to the transparent plate 16 fluctuates more or less to change the distance of the gap between the flat portion 11a and the transparent plate 16, the effects of the second embodiment can be exerted with reliability.

Also in the second embodiment and its modifications, the difference in vertical position between the bottommost and topmost parts of the tapered recess 11b is preferably within 100 to 500 μm. The adhesive layer 20 need not cover the whole of the inclined surface 11b, and need only cover at least part of the inclined surface 11b.

Even if the cross-sectional shape of the tapered recess 11b of the base 10 is not a flat plane like the second embodiment and its modifications but a curve plane, the same effects as the second embodiment and its modifications can be exerted.

Also in the second embodiment and its modifications, the tapered recess 11b and the wall surface inside the opening 12 may be roughened to have a surface roughness Rz of, for example, 5 to 35 μm or more. This prevents the adhesive from entering the opening 12.

Third Embodiment

Figure 3:
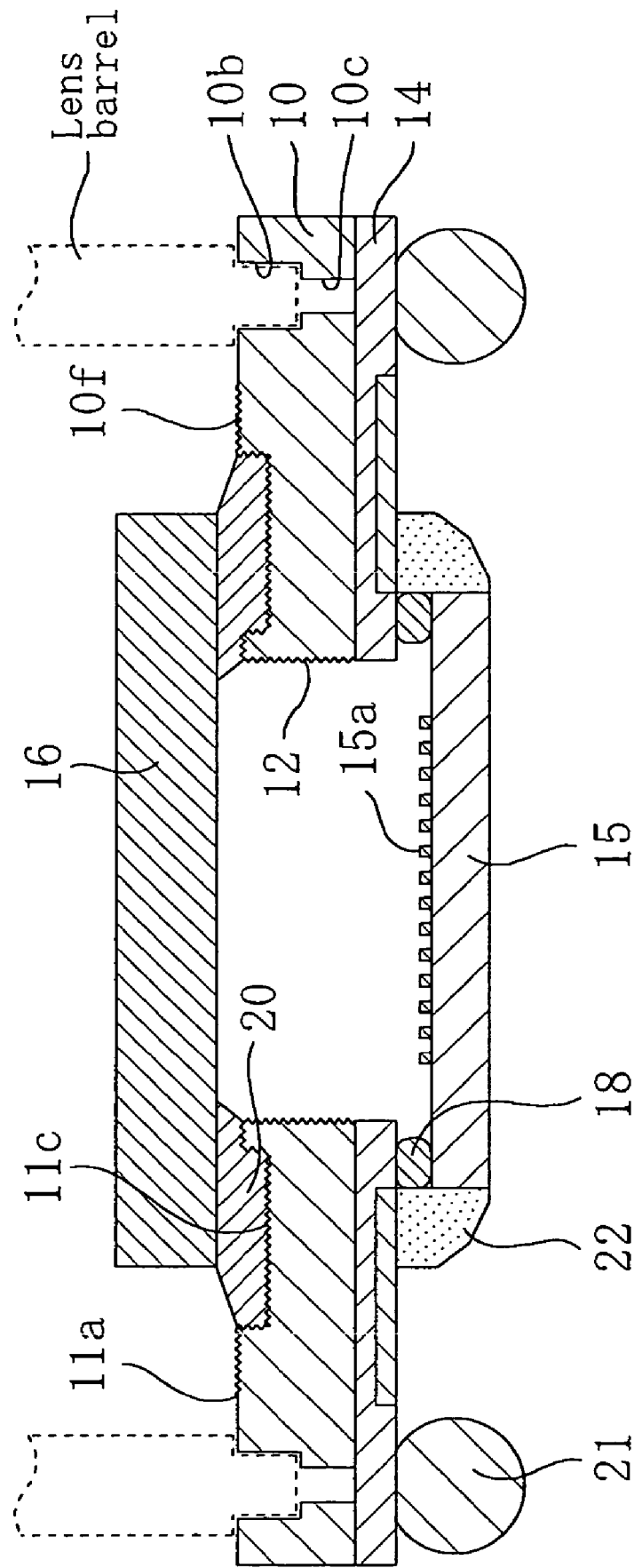
FIG. 3 is a sectional view showing the structure of an optical device according to a third embodiment.

FIG. 3 is a sectional view of an optical device according to a third embodiment. The structure of the optical device of this embodiment is basically similar to that of the first embodiment except for the shape of the recess. Hence, the following description will be made of the points of difference of the third embodiment from the first embodiment.

In the optical device of the third embodiment, a lightly groove-like recess 11c as a recess is formed along the inner perimeter of the upper surface of the base 10. Part of the flat portion 11a is present between the groove-like recess 11c and the inner perimeter of the base 10. The adhesive layer 20 is formed to fill the gap between the groove-like recess 11c and the lower surface of the transparent plate 16. The base 10 is formed with the first positioning hole 10b for determining the position at which the lens barrel is attached to the base 10. Further, in alignment with the first positioning hole 10b, the second positioning hole 10c is formed which has a smaller diameter than the first positioning hole 10b and determines the position at which the optical chip 15 is attached to base 10. That is to say, the positioning holes 10b and 10c constitute a stepped hole. Note that the positioning holes 10b and 10c do not always have to be provided therein.

Moreover, at least an area of the flat portion 11a of the base 10 in contact with the groove-like recess 11c and the wall surfaces inside the groove-like recess 11c and the opening 12 are formed of the roughly finished area 10f having a surface roughness Rz of, for example, 5 to 35 μm or more. The roughly finished area 10f is formed by conducting a resin sealing process using a sandblasted metal mold for sealing. High surface roughness of the flat portion 11a or other portions prevents an adhesive applied to form the adhesive layer 20 from entering the positioning holes 10b and 10c and the opening 12. However, if the entry of the adhesive into the side of the opening 12 does not cause any problem, even the wall surfaces inside the groove-like recess 11c and the opening 12 do not have to be roughly finished. In other words, as long as the roughly finished area 10f is formed in at least a region of the flat portion 11a (upper surface) of the base 10 extending a predetermined distance from just below the side edge of the transparent plate 16, the function of preventing the adhesive flow can be obtained. As a treatment for roughening the surface, a treatment other than the sandblasting, such as etching, can also be used.

In the third embodiment, the groove-like recess 11c as a recess is formed in the upper surface of the base 10, and the adhesive layer 20 is formed in the gap between the groove-like recess 11c and the base 10. Therefore, even if the gap between the flat portion 11a and the transparent plate 16 is narrowed, the adhesive layer 20 in the groove-like recess 11c can be adequately thickened.

Therefore, even though the gap between the lower surface of the transparent plate 16 and the upper surface of the base 10 is narrowed, the mechanical adhesion strength between the transparent plate 16 and the base 10 can be maintained at a high level. Consequently, a downsized optical device with high reliability can be provided.

If the adhesive layer 20 is thickened, at the time of application of an adhesive, a thickly applied adhesive may flow into the first and second positioning holes 10b and 10c. However, in the third embodiment, since part of the flat portion 11a of the base 10 and the like has a high surface roughness, the adhesive flow is stemmed to prevent the adhesive from entering the first and second positioning holes 10b and 10c and the opening 12. Therefore, even if the gap between the lower surface of the transparent plate 16 and the upper surface of the base 10 is narrowed, the mechanical adhesion strength between the transparent plate 16 and the base 10 can be maintained at a high level while problems caused by protrusion of the adhesive are prevented. Consequently, a downsized optical device with high reliability can be provided.

In the flat portion 11a of the upper surface of the base 10 in the third embodiment, the inner perimeter thereof is positioned in overlapping relation with the transparent plate 16 when viewed from above. By this relation, the flat portion 11a supports the transparent plate 16 and further the adequately thick adhesive layer is present between the groove-like recess 11c and the transparent plate 16. Therefore, even if pressure applied to the transparent plate 16 fluctuates more or less to change the distance of the gap between the flat portion 11a and the transparent plate 16, the effects of the third embodiment can be exerted with reliability.

The depth of the groove-like recess 11c in the third embodiment is preferably within 50 to 300 μm.

The cross-sectional shape of the groove is not limited to the rectangular shape shown in FIG. 3, and alternatively various shapes such as a circular shape, a U shape, or a V shape can be employed.

Fourth Embodiment

FIGS. 4A to 4D are sectional views of optical devices according to a fourth embodiment and first to third modifications of the fourth embodiment, respectively.

Referring to FIG. 4A, the optical device of the fourth embodiment basically has the same structure as that of the third embodiment shown in FIG. 3. The device of the fourth embodiment differs from the device of the third embodiment in that the flat portion 11a of the base 10 is formed not to have a rough surface but to have a raised ring 10a located a predetermined distance away from the point of the flat portion 11a below the side edge of the transparent plate 16. The raised ring 10a prevents the adhesive applied to form the adhesive layer 20 from entering the positioning holes 10b and 10c.

In the fourth embodiment, the groove-like recess 11c as a recess is formed in the upper surface of the base 10, and the adhesive layer 20 is formed in the gap between the groove-like recess 11c and the base 10. Therefore, even if the gap between the flat portion 11a and the transparent plate 16 is narrowed, the adhesive layer 20 in the groove-like recess 11c can be adequately thickened. If the adhesive layer 20 is thickened, at the time of application of an adhesive, a thickly applied adhesive may flow into the first and second positioning holes 10b and 10c. However, in the fourth embodiment, since the raised ring 10a is formed on the flat portion 11a of the base 10, the side wall of the raised ring 10a stems the adhesive flow to prevent the adhesive from entering the first and second positioning holes 10b and 10c. Therefore, even if the gap between the lower surface of the transparent plate 16 and the upper surface of the base 10 is narrowed, the mechanical adhesion strength between the transparent plate 16 and the base 10 can be maintained at a high level while protrusion of the adhesive is prevented. Consequently, a downsized optical device with high reliability can be provided.

First Modification of Fourth Embodiment

In a first modification of the fourth embodiment shown in FIG. 4B, as a substitute for the raised portion, a recessed ring 10d is formed in an area of the flat portion 11a of the base 10 a predetermined distance away from the point below the side edge of the transparent plate 16. The recessed ring 10d prevents the adhesive applied to form the adhesive layer 20 from entering the positioning holes 10b and 10c.

In the first modification, the groove-like recess 11c as a recess is formed in the upper surface of the base 10, and the adhesive layer 20 is formed in the gap between the groove-like recess 11c and the base 10. Therefore, even if the gap between the flat portion 11a and the transparent plate 16 is narrowed, the adhesive layer 20 in the groove-like recess 11c can be adequately thickened. If the adhesive layer 20 is thickened, at the time of application of an adhesive, a thickly applied adhesive may flow into the first and second positioning holes 10b and 10c. However, in the first modification, since the recessed ring 10d is formed in the flat portion 11a of the base 10, the adhesive flow is stemmed with the side wall inside the recessed ring 10d to prevent the adhesive from entering the first and second positioning holes 10b and 10c. Therefore, even if the gap between the lower surface of the transparent plate 16 and the upper surface of the base 10 is narrowed, the mechanical adhesion strength between the transparent plate 16 and the base 10 can be maintained at a high level while protrusion of the adhesive is prevented. Consequently, a downsized optical device with high reliability can be provided.

Second Modification of Fourth Embodiment

A second modification of the fourth embodiment shown in FIG. 4C is the same as the fourth embodiment in that the raised ring 10a is formed on the flat portion 11a of the base 10. However, in the second modification, the raised ring 10a functions also as a positioning member of the lens barrel, and the positioning holes 10b and 10c are not provided. Therefore, in the second modification, the radially inner side wall of the raised ring 10a stems outward flow of the adhesive applied to form the adhesive layer 20, while the radially outer side wall of the raised ring 10a positions the lens barrel.

In an edge region 10e of the base 10 located radially inside the groove-like recess 11c, the upper surface thereof is positioned above the flat portion 11a. The difference ΔH in vertical position between the flat portion 11a and the edge region 10e is preferably about 10 to 500 μm. This brings the lower surface of the transparent plate 16 into substantial contact with the upper surface of the edge region 10e of the base 10 located radially inside the groove-like recess 11c. Therefore, the adhesive forming the adhesive layer 20 can be prevented from entering the opening 12 and thus the device can exert a higher reliability. Note that the wording "substantial contact" indicates not only the state in which two planes are in direct contact with each other but also the state in which an extremely thin adhesive layer remains between the two planes depending on pressure applied to the two planes in a fabrication process.

The structure of the device in which the upper surface of the edge region 10e located radially inside the groove-like recess 11c is positioned above the flat portion 11a to bring the lower surface of the transparent plate 16 into contact with the upper surface of the edge region 10e located radially inside the groove-like recess 11c can also be employed for the devices of the fourth embodiment and the first modification of the fourth embodiment. This structure prevents the adhesive forming the adhesive layer 20 from entering the opening 12 and thus the device can exert a higher reliability. Also in this case, the difference ΔH in vertical position between the flat portion 11a and the edge region 10e is preferably about 10 to 500 μm.

In the second modification, the groove-like recess 11c as a recess is formed in the upper surface of the base 10, and the adhesive layer 20 is formed in the gap between the groove-like recess 11c and the base 10. Therefore, even if the gap between the flat portion 11a and the transparent plate 16 is narrowed, the adhesive layer 20 in the groove-like recess 11c can be adequately thickened. If the adhesive layer 20 is thickened, at the time of application of an adhesive, a thickly applied adhesive may flow into the region where the lens barrel will be installed. However, in the second modification, since the raised portion 10a is formed on the flat portion 11a of the base 10, the radially inner side wall of the raised portion 10a stems the adhesive flow to prevent the adhesive from entering the region where the lens barrel will be installed while the radially outer side wall of the raised portion 10a positions the lens barrel.

Therefore, even though the gap between the lower surface of the transparent plate 16 and the upper surface of the base 10 is narrowed, the mechanical adhesion strength between the transparent plate 16 and the base 10 can be maintained at a high level while protrusion of the adhesive is prevented. Consequently, a downsized optical device with high reliability can be provided.

Moreover, the optical device is constructed so that the upper surface of the edge region 10e is positioned above the flat portion 11a to bring the lower surface of the transparent plate 16 into contact with the upper surface of the edge region 10e. This prevents the adhesive forming the adhesive layer 20 from entering the opening 12 and thus the device can exert a higher reliability.

Third Modification of Fourth Embodiment

In a third modification of the fourth embodiment shown in FIG. 4D, the flat portion 11a is present only in the edge region 10e located radially inside the groove-like recess 11c. All region located radially outside the groove-like recess 11c is formed as the raised ring 10a. Moreover, the device is constructed to bring the lower surface of the transparent plate 16 into contact with the upper surface of the edge region 10e. In other words, the upper surface of the edge region 10e located radially inside the groove-like recess 11c is positioned below the raised ring 10a located radially outside the groove-like recess 11c. In the third modification, no second positioning hole is provided although the first positioning hole 10b is provided. The positioning hole 10b in the third modification is a hole with a bottom, but it may alternatively be a through hole.

The first and second positioning holes 10b and 10c are not necessarily required also in the fourth embodiment and even in the first modification of the fourth embodiment. Even though the optical device has either or none of the first and second positioning holes 10b and 10c, the fourth embodiment and the first modification of the fourth embodiment can be applied to exert their effects. The reason for this is as follows. Even if the positioning holes 10b and 10c are absent, an adhesive flow into the region where the lens barrel will be installed would cause problems such as tilted installment of the lens barrel.

Also in the fourth embodiment and its modifications, like the third embodiment, the inner perimeter of the flat portion 11a in the upper portion of the base 10 is positioned in overlapping relation with the transparent plate 16 when viewed from above. By this relation, the flat portion 11a supports the transparent plate 16 and further the adequately thick adhesive layer is present between the groove-like recess 11c and the transparent plate 16. Therefore, even if pressure applied to the transparent plate 16 fluctuates more or less to change the distance of the gap between the flat portion 11a and the transparent plate 16, the effects of the fourth embodiment can be exerted with reliability.

The depth of the groove-like recess 11c of the base 10 in the fourth embodiment and its modifications is preferably within 50 to 300 μm.

The cross-sectional shape of the groove is not limited to the rectangular shape shown in FIGS. 4A to 4D and alternatively various shapes such as a circular shape, a U shape, or a V shape can be employed.

Also in the fourth embodiment and its modifications, the wall surfaces inside the groove-like recess 11c and the opening 12 may be roughened to have a surface roughness Rz of, for example, 5 to 35 μm or more. This prevents the adhesive from entering the opening 12.

Fifth Embodiment

Figure 5:
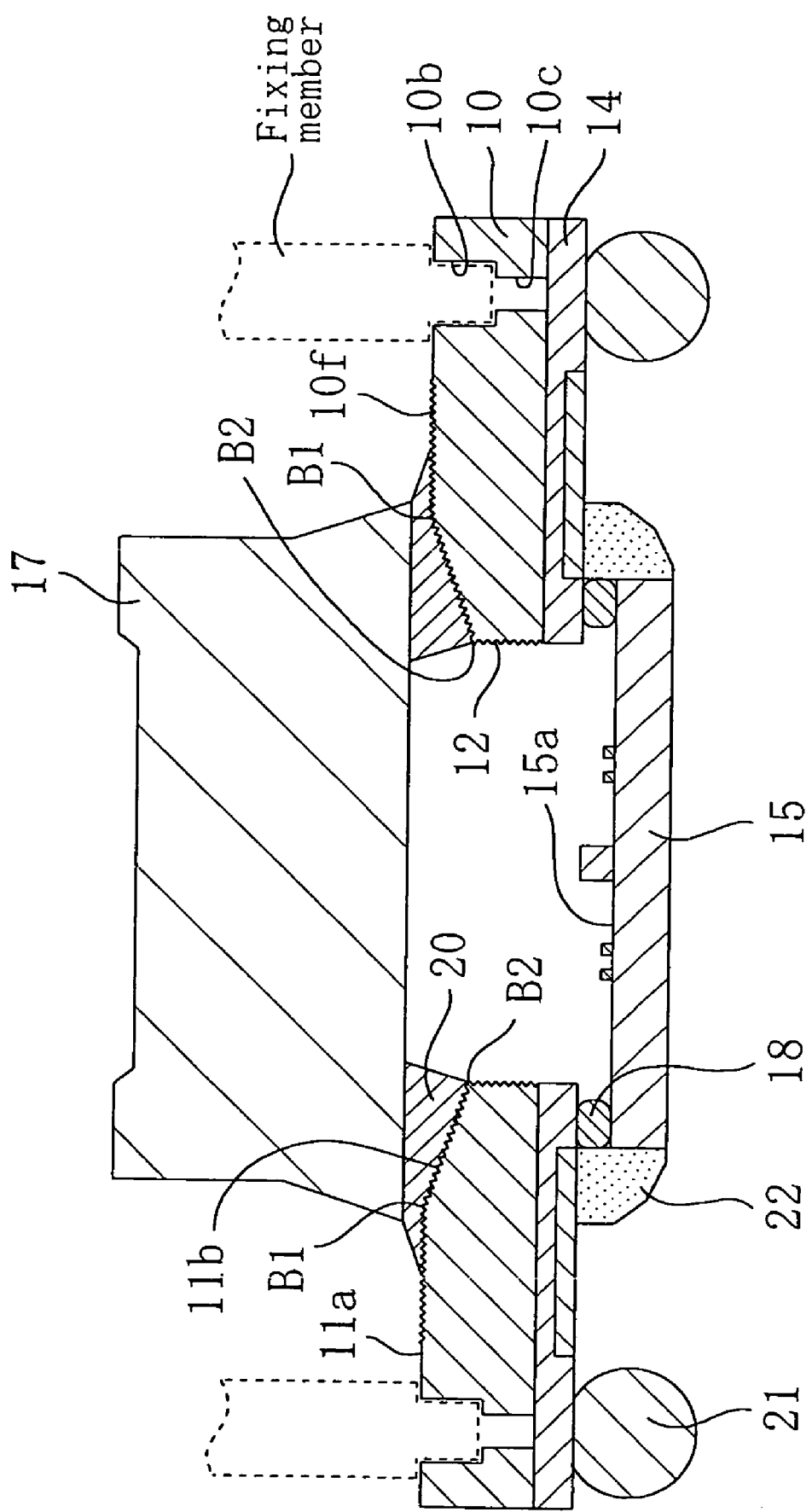
FIG. 5 is a sectional view of an optical device according to a fifth embodiment.

FIG. 5 is a sectional view of an optical device according to a fifth embodiment. The optical device of this embodiment includes, as main components, a base 10, an optical chip 15, a hologram 17, and an adhesive layer 20. The base 10 of frame shape is made of thermosetting resin such as epoxy resin and has an opening 12 in its center portion. The optical chip 15 has a light receiving element and a semiconductor laser (light emitting element) mounted on the main surface 15a thereof, and is attached to the lower surface side of base 10. The hologram 17 is made of resin and attached to the upper surface side of the base 10 so that the hologram faces the main surface 15a of the optical chip 15 with the opening 12 interposed therebetween. The adhesive layer 20 mechanically connects the hologram 17 to the base 10.

The upper surface of the base 10 is formed with a flat portion 11a and a tapered recess 11b as a recess. The adhesive layer 20 is formed to fill a gap between part of the flat portion 11a of the base 10 and the lower surface of the hologram 17 and between the whole of the tapered recess 11b and the lower surface of the hologram 17.

The lower surface of the base 10 is provided with a wire 14 which is made of a gold plated layer and which is embedded in a resin. The optical chip 15 is attached to the lower surface of the base 10 and disposed so that the main surface 15a is exposed in the opening 12.

The optical chip 15 is provided with an electrode pad (not shown) for sending and receiving signals between the optical chip 15 and external equipment. An internal terminal portion is formed in an edge of the wire 14 adjacent to the opening 12, and thus the internal terminal portion of the wire 14 and the electrode pad are electrically connected to each other with a bump (protruding electrode) 18 interposed therebetween. In addition, a solder ball 21 is annexed onto an external terminal portion of the wire 14. On the lower surface side of the base 10, the optical chip 15, the wire 14, and the bump 18 are hermetically sealed with a sealing resin 22 provided around the optical chip 15.

The main surface 15a of the optical chip 15 is disposed within the opening 12 when viewed from above. In the optical device of the fifth embodiment, instead of the transparent plate 16, the hologram 17 is put above the upper surface of the base 10. The hologram 17 splits light radiated from a semiconductor laser toward recording media or the like and reflected and returned from the media, and transfers the split beams into multiple light receiving elements. In this embodiment, the material forming the hologram 17 is resin (plastic), but glass may alternatively be used thereas.

As shown by the broken lines in FIG. 5, a fixing member for fixing an objective lens is installed onto the base 10. The positional relation between the fixing member (the objective lens) and the base 10 has a defined accuracy required to fall within a predetermined error. The base 10 is formed with a first positioning hole 10b for determining the position at which the fixing member is attached to the base 10. Further, in alignment with the first positioning hole 10b, a second positioning hole 10c is formed which has a smaller diameter than the first positioning hole 10b and determines the position at which the optical chip 15 is attached to base 10. That is to say, the positioning holes 10b and 10c constitute a stepped hole. Note that the positioning holes 10b and 10c do not always have to be provided therein.

Moreover, at least an area of the flat portion 11a of the base 10 in contact with the tapered recess 11b, the tapered recess 11b, and the wall surface inside the opening 12 are formed of a roughly finished area 10f having a surface roughness Rz of, for example, 5 to 35 μm or more. The roughly finished area 10f is formed by conducting a resin sealing process using a sandblasted metal mold for sealing. High surface roughness of the flat portion 11a or other portions prevents an adhesive applied to form the adhesive layer 20 from entering the positioning holes 10b and 10c and the opening 12. However, if the entry of the adhesive into the side of the opening 12 does not cause any problem, even the tapered recess 11b and the wall surface inside the opening 12 do not have to be roughly finished. In other words, as long as the roughly finished area 10f is formed at least over a region of the flat portion 11a (upper surface) of the base 10 extending outwardly a predetermined distance from just below the side edge of the hologram 17, the function of preventing the adhesive flow can be obtained. As a treatment for roughening the surface, a treatment other than the sandblasting, such as etching, can also be used.

In the fifth embodiment, the tapered recess 11b as a recess is formed in the upper surface of the base 10, and the adhesive layer 20 is formed in the gap between the tapered recess 11b and the transparent plate 16. Therefore, even if the gap between the flat portion 11a and the hologram 17 is narrowed, the adhesive layer 20 in the tapered recess 11b can be adequately thickened. If the adhesive layer 20 is thickened, at the time of application of an adhesive, a thickly applied adhesive may flow into the first and second positioning holes 10b and 10c and into the side of the opening 12. However, in the fifth embodiment, since part of the flat portion 11a of the base 10 and the like has a high surface roughness, the adhesive flow is stemmed to prevent the adhesive from entering the first and second positioning holes 10b and 10c and the opening 12. Therefore, even if the gap between the lower surface of the hologram 17 and the upper surface of the base 10 is narrowed, the mechanical adhesion strength between the hologram 17 and the base 10 can be maintained at a high level while problems caused by protrusion of the adhesive are prevented. Consequently, a downsized optical device with high reliability can be provided.

In the fifth embodiment, the boundary B1 between the flat portion 11a and the tapered recess 11b of the upper surface of the base 10 is positioned in overlapping relation with the hologram 17 when viewed from above. By this relation, the flat portion 11a supports the hologram 17 and further the adequately thick adhesive layer is present between the tapered recess 11b and the hologram 17. Therefore, even if, in forming the adhesive layer 20, pressure applied to the hologram 17 fluctuates more or less to change the distance of the gap between the flat portion 11a and the hologram 17, the effects of the fifth embodiment can be exerted with reliability.

In the fifth embodiment, the difference in vertical position between the bottommost and topmost parts of the tapered recess 11b is preferably within 100 to 500 μm. The adhesive layer 20 need not cover the whole of the inclined surface 11b, and need only cover at least part of the inclined surface 11b.

Even if the cross-sectional shape of the tapered recess 11b of the base 10 is not a flat plane like the fifth embodiment but a curve plane, the same effects as the fifth embodiment can be exerted.

Sixth Embodiment

FIGS. 6A to 6D are sectional views of optical devices according to a sixth embodiment and first to third modifications of the sixth embodiment, respectively.

Figure 6A:
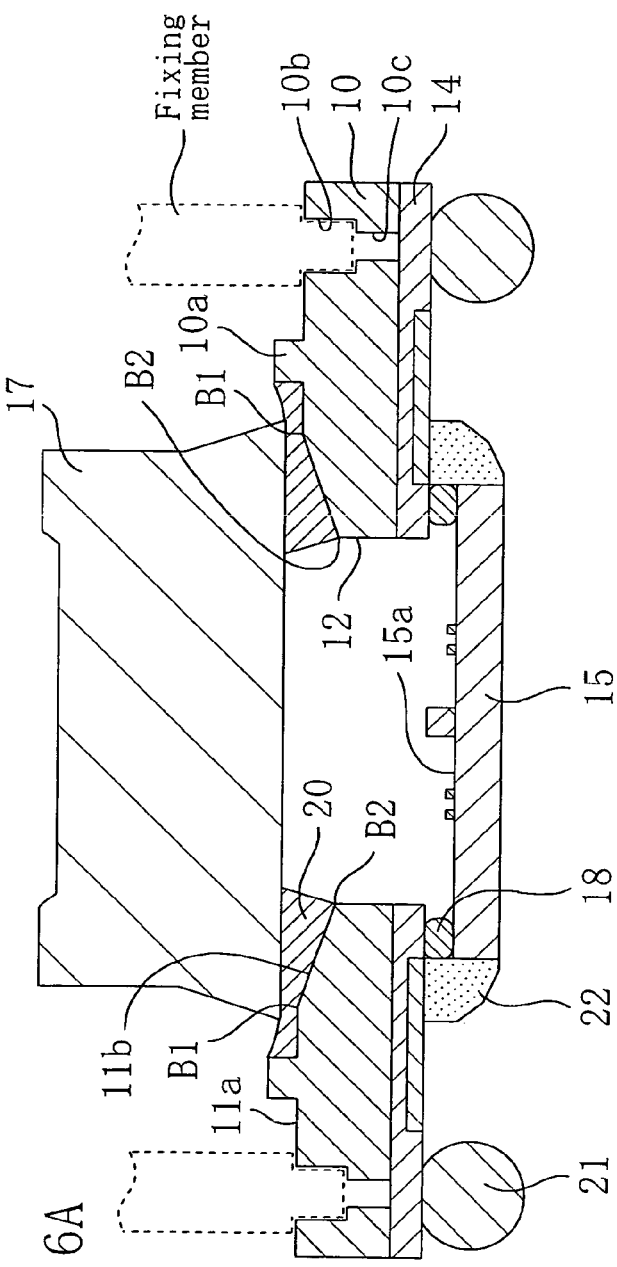
FIGS. 6A to 6D are sectional views of optical devices according to a sixth embodiment and first to third modifications of the sixth embodiment, respectively.

Referring to FIG. 6A, the optical device of the sixth embodiment basically has the same structure as that of the fifth embodiment shown in FIG. 5. The device of the sixth embodiment differs from the device of the fifth embodiment in that the flat portion 11a of the base 10 is formed not to have a rough surface but to have a raised ring 10a located a predetermined distance away from the point of the flat portion 11a below the side edge of the hologram 17. The raised ring 10a prevents the adhesive applied to form the adhesive layer 20 from entering the positioning holes 10b and 10c.

In the sixth embodiment, the tapered recess 11b as a recess is formed in the upper surface of the base 10, and the adhesive layer 20 is formed in the gap between the tapered recess 11b and the transparent plate 16. Therefore, even if the gap between the flat portion 11a and the hologram 17 is narrowed, the adhesive layer 20 in the tapered recess 11b can be adequately thickened. This maintains the mechanical adhesion strength between the hologram 17 and the base 10 at a high level even if the gap between the lower surface of the hologram 17 and the upper surface of the base 10 is narrowed. Consequently, a downsized optical device with high reliability can be provided.

If the adhesive layer 20 is thickened, at the time of application of an adhesive, a thickly applied adhesive may flow into the positioning holes 10b and 10c. However, in the sixth embodiment, since the raised ring 10a is formed on the flat portion 11a of the base 10, the side wall of the raised ring 10a stems the adhesive flow to prevent the adhesive from entering the positioning holes 10b and 10c. Therefore, even if the gap between the lower surface of the hologram 17 and the upper surface of the base 10 is narrowed, the mechanical adhesion strength between the hologram 17 and the base 10 can be maintained at a high level while protrusion of the adhesive is prevented. Consequently, a downsized optical device with high reliability can be provided.

First Modification of Sixth Embodiment

Figure 6B:
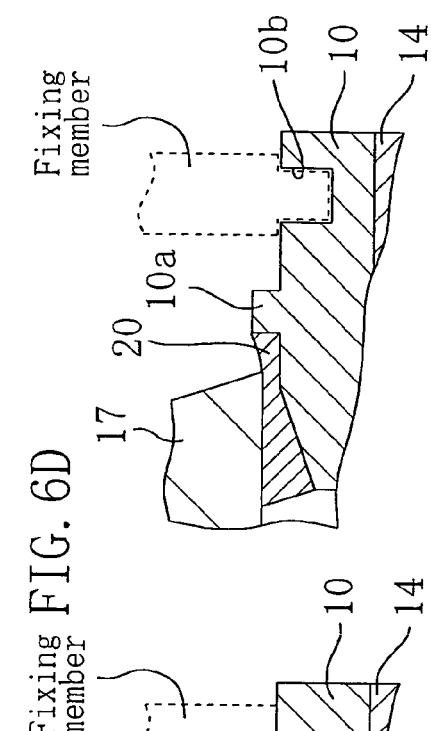

In a first modification of the sixth embodiment shown in FIG. 6B, as a substitute for the raised ring, a recessed ring 10d is formed in an area of the flat portion 11a of the base 10 a predetermined distance away from the point below the side edge of the hologram 17. The recessed ring 10d prevents the adhesive applied to form the adhesive layer 20 from entering the positioning holes 10b and 10c.

In the first modification, the tapered recess 11b as a recess is formed in the upper surface of the base 10, and the adhesive layer 20 is formed in the gap between the tapered recess 11b and the transparent plate 16. Therefore, even if the gap between the flat portion 11a and the hologram 17 is narrowed, the adhesive layer 20 in the tapered recess 11b can be adequately thickened. If the adhesive layer 20 is thickened, at the time of application of an adhesive, a thickly applied adhesive may flow into the first and second positioning holes 10b and 10c. However, in the first modification, since the recessed ring 10d is formed in the flat portion 11a of the base 10, the adhesive flow is stemmed with the side wall inside the recessed ring 10d to prevent the adhesive from entering the first and second positioning holes 10b and 10c. Therefore, even if the gap between the lower surface of the hologram 17 and the upper surface of the base 10 is narrowed, the mechanical adhesion strength between the hologram 17 and the base 10 can be maintained at a high level while protrusion of the adhesive is prevented. Consequently, a downsized optical device with high reliability can be provided.

Second Modification of Sixth Embodiment

Figure 6C:
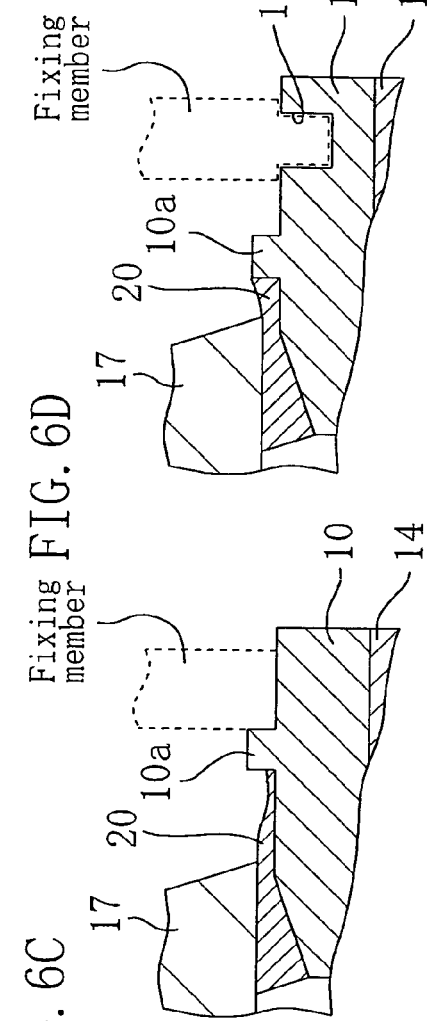

A second modification of the sixth embodiment shown in FIG. 6C is the same as the sixth embodiment in that the raised ring 10a is formed on the flat portion 11a of the base 10. However, in the second modification, the raised ring 10a functions also as a positioning member of the fixing member, and the positioning holes 10b and 10c are not provided. Therefore, in the second modification, the radially inner side wall of the raised ring 10a stems outward flow of the adhesive applied to form the adhesive layer 20, and the radially outer side wall of the raised ring 10a positions the fixing member.

In the second modification, the tapered recess 11b as a recess is formed in the upper surface of the base 10, and the adhesive layer 20 is formed in the gap between the tapered recess 11b and the transparent plate 16. Therefore, even if the gap between the flat portion 11a and the hologram 17 is narrowed, the adhesive layer 20 in the tapered recess 11b can be adequately thickened. If the adhesive layer 20 is thickened, at the time of application of an adhesive, a thickly applied adhesive may flow into the region where the fixing member will be installed. However, in the second modification, since the raised ring 10a is formed on the flat portion 11a of the base 10, the radially inner side wall of the raised ring 10a stems the adhesive flow to prevent the adhesive from entering the region where the fixing member will be installed while the radially outer side wall of the raised ring 10a positions the fixing member. Therefore, even if the gap between the lower surface of the hologram 17 and the upper surface of the base 10 is narrowed, the mechanical adhesion strength between the hologram 17 and the base 10 can be maintained at a high level while protrusion of the adhesive is prevented. Consequently, a downsized optical device with high reliability can be provided.

Third Modification of Sixth Embodiment

Figure 6D:
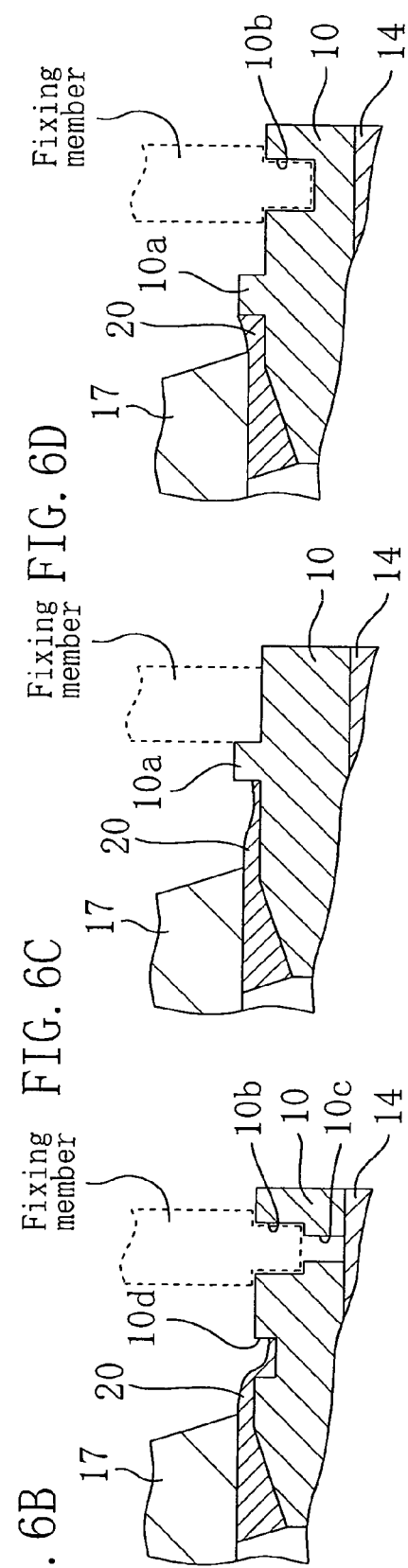

A third modification of the sixth embodiment shown in FIG. 6D is the same as the sixth embodiment in that the raised ring 10a is formed on the flat portion 11a of the base 10. However, in the third modification, no second positioning hole is provided although the first positioning hole 10b is provided. The positioning hole 10b in the third modification is a hole with a bottom, but it may alternatively be a through hole.

The first and second positioning holes 10b and 10c are not necessarily required also in the fifth and sixth embodiments and the first modification of the sixth embodiment. Also to the optical device having either or none of the first and second positioning holes 10b and 10c, the fifth and sixth embodiments and the first modification of the sixth embodiment can be applied to exert their effects. The reason for this is as follows. Even if the positioning holes 10b and 10c are absent, an adhesive flow into the region where the fixing member will be installed would cause problems such as tilted installment of the fixing member.

Also in the sixth embodiment and its modifications, like the fifth embodiment, the boundary B1 between the flat portion 11a and the tapered recess 11b of the upper surface of the base 10 is positioned in overlapping relation with the hologram 17 when viewed from above. By this relation, the flat portion 11a supports the hologram 17 and further the adequately thick adhesive layer is present between the tapered recess 11b and the hologram 17. Therefore, even if, in forming the adhesive layer 20, pressure applied to the hologram 17 fluctuates more or less to change the distance of the gap between the flat portion 11a and the hologram 17, the effects of the sixth embodiment can be exerted with reliability.

Also in the sixth embodiment and its modifications, the difference in vertical position between the bottommost and topmost parts of the tapered recess 11b is preferably within 100 to 500 μm. The adhesive layer 20 need not cover the whole of the inclined surface 11b, and need only cover at least part of the inclined surface 11b.

Even if the cross-sectional shape of the tapered recess 11b of the base 10 is not a flat plane like the sixth embodiment and its modifications but a curve plane, the same effects as the sixth embodiment and its modifications can be exerted.

Also in the sixth embodiment and its modifications, the tapered recess 11b and the wall surface inside the opening 12 may be roughened to have a surface roughness Rz of, for example, 5 to 35 μm or more. This prevents the adhesive from entering the opening 12.

In the fifth and sixth embodiments and the modifications of the sixth embodiment, the groove-like recess 11c shown in the third and fourth embodiments and the modifications of the fourth embodiment can be provided as a substitute for the tapered recess 11b, and the structure of the base 10 shown in the third and fourth embodiments and the modifications of the fourth embodiment can be employed. Such an optical device including a hologram unit can exert the same effects as the third and fourth embodiments and the modifications of the fourth embodiment.

Seventh Embodiment

Figure 7:
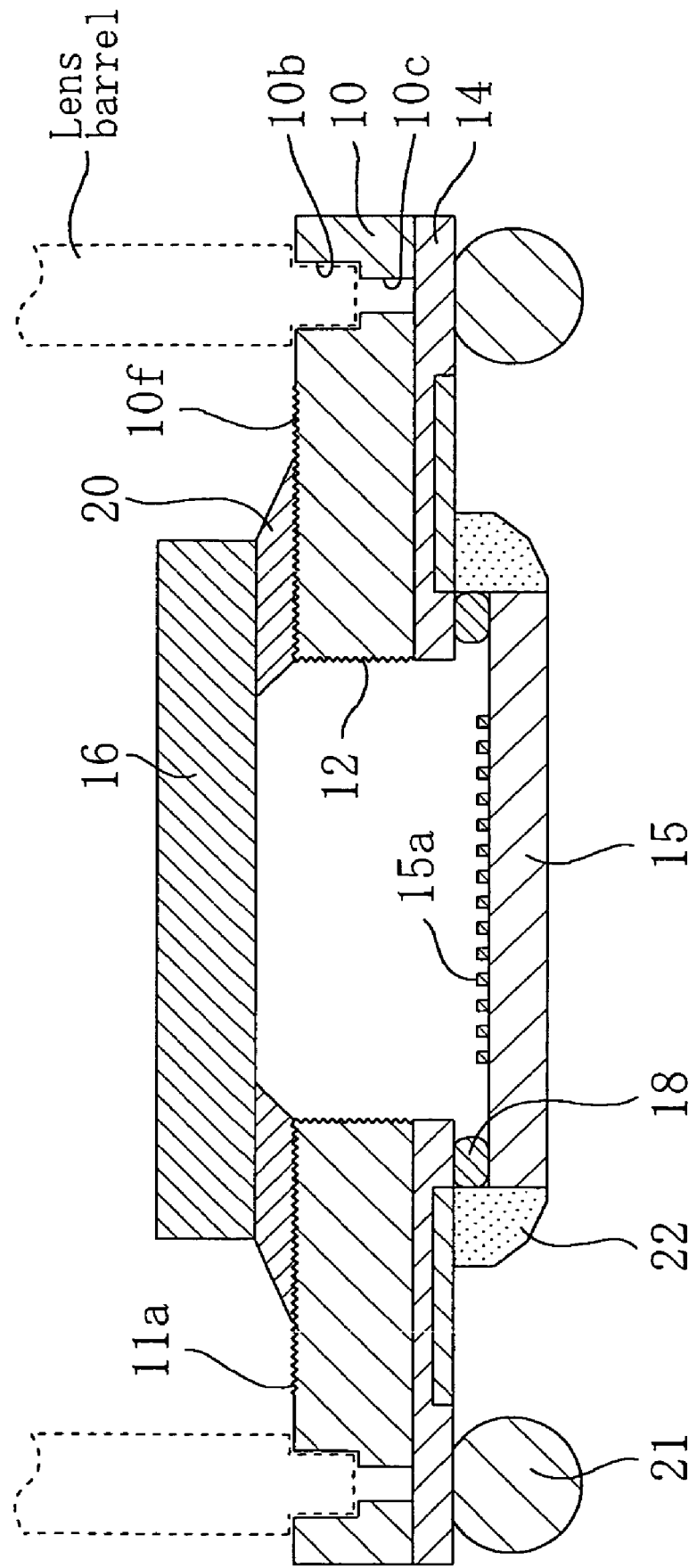
FIG. 7 is a sectional view of an optical device according to a seventh embodiment.
Figure 9:
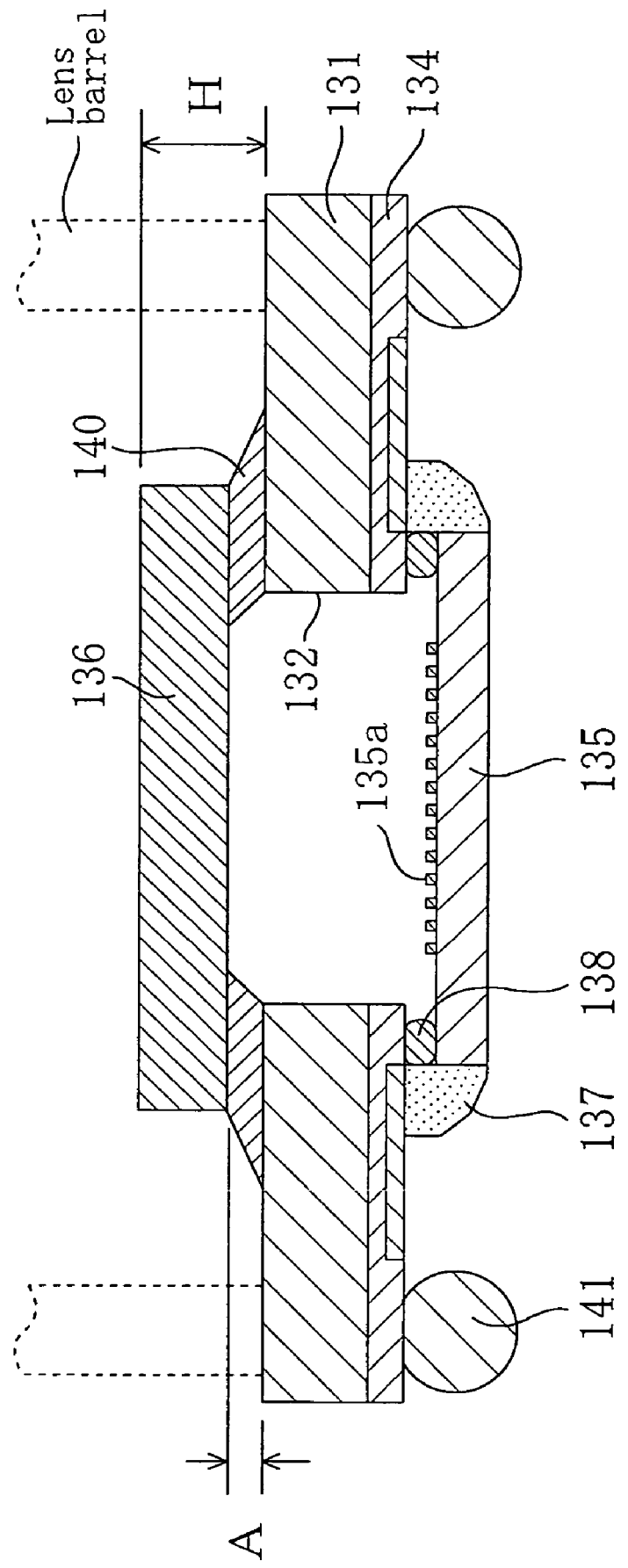
FIG. 9 is a sectional view showing the structure of a conventional optical device.

FIG. 7 is a sectional view of an optical device according to a seventh embodiment. The optical device of this embodiment includes, as main components, a base 10, an optical chip 15, a transparent plate 16, and an adhesive layer 20. The base 10 of frame shape is made of thermosetting resin such as epoxy resin and has an opening 12 in its center portion. The optical chip 15 is attached to the lower surface side of base 10. The transparent plate 16 is made of glass and attached to the upper surface side of the base 10 so that the plate faces the optical chip 15 with the opening 12 interposed therebetween. The adhesive layer 20 mechanically connects the transparent plate 16 to the base 10. The optical chip 15 of the seventh embodiment indicates only a light receiving element such as a CCD solid-state image sensing element. However, a light receiving element and a semiconductor laser (light emitting element) may be installed in the optical chip 15. In this case, if the optical device of the seventh embodiment is incorporated in an optical pickup or the like, the transparent plate 16 is removed and a hologram as shown in the fifth embodiment is then attached onto the base 10 (to form a hologram unit).

The lower surface of the base 10 is provided with a wire 14 which is made of a gold plated layer and which is embedded in a resin. The optical chip 15 is attached to the lower surface of the base 10 and disposed so that a main surface 15a thereof is exposed in the opening 12.

The optical chip 15 is provided with an electrode pad (not shown) for sending and receiving signals between the optical chip 15 and external equipment. An internal terminal portion is formed in an edge of the wire 14 adjacent to the opening 12, and thus the internal terminal portion of the wire 14 and the electrode pad are electrically connected to each other with a bump (protruding electrode) 18 interposed therebetween. In addition, a solder ball 21 is annexed onto an external terminal portion of the wire 14. On the lower surface side of the base 10, the optical chip 15, the wire 14, and the bump 18 are hermetically sealed with a sealing resin 22 provided around the optical chip 15.

The optical device thus constructed is mounted on a circuit board so that the transparent plate 16 is directed upward as shown in FIG. 7. A lens barrel with an optical imaging system incorporated therein is installed onto the base 10 as shown by the broken lines in FIG. 7. The positional relation between the lens barrel and the base 10 has a defined accuracy required to fall within a predetermined error. The base 10 is formed with a first positioning hole 10b for determining the position at which the lens barrel is attached to the base 10. Further, in alignment with the first positioning hole 10b, a second positioning hole 10c is formed which has a smaller diameter than the first positioning hole 10b and determines the position at which the optical chip 15 is attached to base 10. That is to say, the positioning holes 10b and 10c constitute a stepped hole. Note that the positioning holes 10b and 10c do not always have to be provided therein.

As mentioned above, the main surface 15a of the optical chip 15 is disposed in the opening 12 when viewed from above. Through the optical system incorporated in the lens barrel, light from an imaged object is condensed on the main surface of the optical chip 15.

As shown in FIG. 7, in the seventh embodiment, the entire upper surface of the base 10 is formed of a flat portion 11a. The adhesive layer 20 is formed to fill a gap between part of the flat portion 11a of the base 10 and the lower surface of the transparent plate 16. Moreover, at least an area of the flat portion 11a of the base 10 adjoining the opening 12 and the wall surface inside the opening 12 are formed of a roughly finished area 10f having a surface roughness Rz of, for example, 5 to 35 μm or more. The roughly finished area 10f is formed by conducting a resin sealing process using a sand-blasted metal mold for sealing. High surface roughness of the flat portion 11a or other portions prevents an adhesive applied to form the adhesive layer 20 from entering the positioning holes 10b and 10c and the opening 12. However, if the entry of the adhesive into the side of the opening 12 does not cause any problem, even the wall surface inside the opening 12 does not have to be roughly finished. In other words, as long as the roughly finished area 10f is formed in at least a region of the flat portion 11a (upper surface) of the base 10 extending a predetermined distance from just below the side edge of the transparent plate 16, the function of preventing the adhesive flow can be obtained. As a treatment for roughening the surface, a treatment other than the sandblasting, such as etching, can also be used.

If the adhesive layer 20 is thickened in order to improve the adhesion strength between the base 10 and the transparent plate 16, at the time of application of an adhesive, a thickly applied adhesive may flow into the first and second positioning holes 10b and 10c and into the side of the opening 12. However, in the seventh embodiment, since part of the flat portion 11a of the base 10 and the like has a high surface roughness, the adhesive flow is stemmed to prevent the adhesive from entering the first and second positioning holes 10b and 10c and the opening 12. Therefore, with the seventh embodiment, the adhesive layer 20 can be thickened to maintain the mechanical adhesion strength between the transparent plate 16 and the base 10 at a high level while problems caused by protrusion of the adhesive are prevented. Consequently, a downsized optical device with high reliability can be provided.

Eighth Embodiment

FIGS. 8A to 8D are sectional views of optical devices according to an eighth embodiment and first to third modifications of the eighth embodiment, respectively.

Referring to FIG. 8A, the optical device of the eighth embodiment basically has the same structure as that of the seventh embodiment shown in FIG. 7. The device of the eighth embodiment differs from the device of the seventh embodiment in that the flat portion 11a of the base 10 is formed not to have a rough surface but to have a raised ring 10a located a predetermined distance outwardly away from the point of the flat portion 11a below the transparent plate 16. The raised ring 10a prevents the adhesive applied to form the adhesive layer 20 from entering the positioning holes 10b and 10c.

If the adhesive layer 20 is thickened in order to improve the adhesion strength between the base 10 and the transparent plate 16, at the time of application of an adhesive, a thickly applied adhesive may flow into the positioning holes 10b and 10c. However, in the eighth embodiment, since the raised ring 10a is formed on the flat portion 11a of the base 10, the side wall of the raised ring 10a stems the adhesive flow to prevent the adhesive from entering the positioning holes 10b and 10c. Therefore, with the eighth embodiment, the adhesive layer 20 can be thickened to maintain the mechanical adhesion strength between the transparent plate 16 and the base 10 at a high level while protrusion of the adhesive is prevented. Consequently, a downsized optical device with high reliability can be provided.

First Modification of Eighth Embodiment

In a first modification of the eighth embodiment shown in FIG. 8B, as a substitute for the raised ring, a recessed ring 10d is formed in an area of the flat portion 11a of the base 10 a predetermined distance outwardly away from the point below the transparent plate 16. The recessed ring 10d prevents the adhesive applied to form the adhesive layer 20 from entering the positioning holes 10b and 10c.

If the adhesive layer 20 is thickened in order to improve the adhesion strength between the base 10 and the transparent plate 16, at the time of application of an adhesive, a thickly applied adhesive may flow into the first and second positioning holes 10b and 10c. However, in the first modification, since the recessed ring 10d is formed in the flat portion 11a of the base 10, the adhesive flow is stemmed with the side wall inside the recessed ring 10d to prevent the adhesive from entering the first and second positioning holes 10b and 10c. Therefore, with the first modification, the adhesive layer 20 can be thickened to maintain the mechanical adhesion strength between the transparent plate 16 and the base 10 at a high level while protrusion of the adhesive is prevented. Consequently, an optical device with high reliability can be provided.

Second Modification of Eighth Embodiment

A second modification of the eighth embodiment shown in FIG. 8C is the same as the eighth embodiment in that the raised ring 10a is formed on the flat portion 11a of the base 10. However, in the second modification, the raised ring 10a functions also as a positioning member of the lens barrel, and the positioning holes 10b and 10c are not provided. Therefore, in the second modification, the radially inner side wall of the raised ring la stems outward flow of the adhesive applied to form the adhesive layer 20, while the radially outer side wall of the raised ring 10a positions the lens barrel.

If the adhesive layer 20 is thickened in order to improve the adhesion strength between the base 10 and the transparent plate 16, at the time of application of an adhesive, a thickly applied adhesive may flow into the region where the lens barrel will be installed. However, in the second modification, since the raised ring 10a is formed on the flat portion 11a of the base 10, the radially inner side wall of the raised ring 10a stems the adhesive flow to prevent the adhesive from entering the region where the lens barrel will be installed while the radially outer side wall of the raised ring 10a positions the lens barrel. Therefore, with the second modification, the adhesive layer 20 can be thickened to maintain the mechanical adhesion strength between the transparent plate 16 and the base 10 at a high level while protrusion of the adhesive is prevented. Consequently, an optical device with high reliability can be provided.

Third Modification of Eighth Embodiment

A third modification of the eighth embodiment shown in FIG. 8D is the same as the eighth embodiment in that the raised ring 10a is formed on the flat portion 11a of the base 10. However, in the third modification, no second positioning hole is provided although the first positioning hole job is provided. The positioning hole 10b in the third modification is a hole with a bottom, but it may alternatively be a through hole.

The first and second positioning holes 10b and 10c are not necessarily required also in the seventh and eighth embodiments and the first modification of the eighth embodiment. Also to the optical device having either or none of the first and second positioning holes 10b and 10c, the seventh and eighth embodiments and the first modification of the eighth embodiment can be applied to exert their effects. The reason for this is as follows. Even if the positioning holes 10b and 10c are absent, an adhesive flow into the region where the lens barrel will be installed would cause problems such as tilted installment of the lens barrel.

Also in the eighth embodiment and its modifications, the wall surface inside the opening 12 may be roughened to have a surface roughness Rz of, for example, 5 to 35 μm or more. This prevents the adhesive from entering the opening 12.

In the structures shown in the drawings relating to the embodiments described above, only the radially outer side of the bump 18 is filled with the sealing resin 22. However, as long as the sealing resin 22 does not overlap with the pixel-arranging surface of the light receiving element, the sealing resin 22 can also be provided on both the radially inner and outer sides of the bump 18 for the purpose of improving the adhesion.

The optical device according to the present invention can be utilized as an image sensor, a hologram unit, and the like which are produced by mounting an optical chip and which are used for a camera such as a camcorder, a digital camera, or a digital still camera and an optical pickup system for CD, DVD, or MD.

What is claimed is:

1. An optical device comprising:
   a base of ring shape with a tapered recess surrounding an opening;
   an optical chip mounted so that a main surface thereof with an optical element disposed is exposed within the opening of the base when viewed from above;
   a transparent member attached above an upper surface of the base; and
   an adhesive layer provided in a gap between the base and the transparent member,
   wherein the upper surface of the base has a taper so that the thickness of the base becomes thin toward the opening in the tapered recess, and
   in the region of the tapered recess except for an inner surface of the opening, the distance from a portion of the tapered recess that is located in the upper surface of the base and is joined with the inner surface of the opening to the bottom of the base is smaller than the distance from a portion of the tapered recess that is located in the upper surface of the base other than the portion of the tapered recess that is joined with the inner surface of the opening to the bottom of the base.

2. The device of claim 1,
   wherein the upper surface of the base where the tapered recess is formed has a surface roughness Rz of 5 to 35μm.

3. The device of claim 1,
   wherein the upper surface of the base has a raised ring at a location a predetermined distance outwardly away from just below the side edge of the transparent member.

4. The device of claim 3,
   wherein the inner side wall of the raised ring has the function of stemming a flow of adhesive forming the adhesive layer while the outer side wall thereof has the function of determining the position at which a member to be annexed onto the optical device is attached.

5. The device of claim 1,
   wherein the upper surface of the base has a recessed ring at a location a predetermined distance outwardly away from just below the side edge of the transparent member.

6. The device of claim 1,
   wherein the base is provided with a positioning hole serving as a reference to the position at which a member to be annexed onto the optical device is attached.

7. The device of claim 1,
   wherein the optical element comprises a light receiving element and a light emitting element, and
   the transparent member is a hologram.

8. The device of claim 1,
   wherein the transparent member is a transparent plate.

9. The device of claim 1, wherein
   a wire is formed on a back surface of the base.

10. An optical device comprising:
    a base of ring shape with a tapered recess surrounding an opening;
    an optical chip mounted so that a main surface thereof with an optical element disposed is exposed within the opening of the base when viewed from above;
    a transparent member attached above an upper surface of the base; and
    an adhesive layer filling a gap between the base and the transparent member,
    wherein the upper surface of the base extending outwardly a predetermined distance from just below the side edge of the transparent member has a surface roughness Rz of 5 to 35μm, and
    in the region of the tapered recess except for an inner surface of the opening, the distance from a portion of the tapered recess that is located in the upper surface of the base and is joined with the inner surface of the opening to the bottom of the base is smaller than the distance from a portion of the tapered recess that is located in the upper surface of the base other than the portion of the tapered recess that is joined with the inner surface of the opening to the bottom of the base.

11. The device of claim 10, wherein the base is provided with a positioning hole serving as a reference to the position at which a member to be annexed onto the optical device is attached.

12. The device of claim 10, wherein the optical element comprises a light receiving element and a light emitting element, and the transparent member is a hologram.

13. The device of claim 10, wherein the transparent member is a transparent plate.

14. An optical device comprising:
a base of ring shape with a tapered recess surrounding an opening;
an optical chip mounted so that a main surface thereof with an optical element disposed is exposed within the opening of the base when viewed from above;
a transparent member attached above the upper surface of the base; and
an adhesive layer filling a gap between the base and the transparent member,
wherein the upper surface of the base has a raised ring at a location a predetermined distance outwardly away from just below the side edge of the transparent member,
the outer side wall of the raised ring has the function of the determining the position at which a member to be annexed onto the optical device is attached,
in the region of the tapered recess except for an inner surface of the opening, the distance from a portion of the tapered recess that is located in the upper surface of the base and is joined with the inner surface of the opening to the bottom of the base is smaller than the distance from a portion of the tapered recess that is located in the upper surface of the base other than the portion of the tapered recess that is joined with the inner surface of the opening to the bottom of the base.

15. The device of claim 14, wherein the inner side wall of the raised ring has the function of stemming a flow of adhesive forming the adhesive layer.

16. The device of claim 14, wherein the optical element comprises a light receiving element and a light emitting element, and the transparent member is a hologram.

17. The device of claim 14, wherein the transparent member is a transparent plate.

18. The device of claim 14, wherein the upper surface of the base has a taper so that the thickness of the base becomes thin toward the opening.

19. The device of claim 14, wherein the upper tapered recess is just below the transparent member.

20. The device of claim 19, wherein the tapered recess is filled with the adhesive layer.

21. The device of claim 14, wherein the upper surface of the base extending outwardly a predetermined distance from just below the side edge of the transparent member has a surface roughness Rz of 5 to 35μm.

\* \* \* \* \*